US008274286B2

(12) United States Patent
Koch et al.

(10) Patent No.: US 8,274,286 B2
(45) Date of Patent: Sep. 25, 2012

(54) SYSTEM AND METHOD FOR MULTI-SPECTRAL MR IMAGING NEAR METAL

(75) Inventors: Kevin M. Koch, Milwaukee, WI (US); Kevin F. King, Menomonee Falls, WI (US); Graeme C. McKinnon, Hartland, WI (US); Brian Hargreaves, Menlo Park, CA (US)

(73) Assignees: General Electric Company, Schenectady, NY (US); The Board of Trustees of the Leland Standford, Jr. University, Palo Alto, CA (US)

( * ) Notice: Subject to any disclaimer, the term of this patent is extended or adjusted under 35 U.S.C. 154(b) by 287 days.

(21) Appl. No.: 12/860,272

(22) Filed: Aug. 20, 2010

(65) Prior Publication Data

US 2010/0308827 A1 Dec. 9, 2010

Related U.S. Application Data

(63) Continuation-in-part of application No. 12/016,331, filed on Jan. 18, 2008, now Pat. No. 7,821,264.

(51) Int. Cl.
*G01V 3/00* (2006.01)
(52) U.S. Cl. .......................... 324/309; 324/300; 324/310
(58) Field of Classification Search ........................ None
See application file for complete search history.

(56) References Cited

U.S. PATENT DOCUMENTS

| 5,488,305 | A | * | 1/1996 | Bloom et al. | ................. | 324/537 |
| 5,537,039 | A |   | 7/1996 | Le Roux et al. | | |
| 6,150,815 | A |   | 11/2000 | Janzen et al. | | |
| 6,445,182 | B1 |   | 9/2002 | Dean et al. | | |
| 6,584,337 | B2 |   | 6/2003 | Dumoulin et al. | | |
| 7,495,439 | B2 | * | 2/2009 | Wiggins | ......................... | 324/309 |
| 7,557,575 | B2 |   | 7/2009 | Ookawa et al. | | |
| 7,573,269 | B2 |   | 8/2009 | Yao | | |
| 2010/0033179 | A1 |   | 2/2010 | Hargreaves et al. | | |

OTHER PUBLICATIONS

Butts et al., "Correction of Slice Profile Distortion from Metallic Devices," Proc. Intl. Soc. Mag. Reson. Med., vol. 14, 2006, p. 2380.
Butts et al., "Reduction of Blurring in View Angle Tilting MRI," Magnetic Resonance in Medicine, vol. 53, 2005, pp. 418-424.
Edelman et al., "Gadolinium-Enhanced Off-Resonance Contrast Angiography," Magnetic Resonance in Medicine, vol. 57, 2007, pp. 475-484.

(Continued)

*Primary Examiner* — Jermele M Hollington
*Assistant Examiner* — Trung Nguyen
(74) *Attorney, Agent, or Firm* — Ziolkowski Patent Solutions Group, SC

(57) ABSTRACT

A system and method for multi-spectral MR imaging near metal include a computer programmed to calculate an MR pulse sequence comprising a plurality of RF pulses configured to excite spins in an imaging object and comprising a plurality of volume selection gradients and determine a plurality of distinct offset frequency values. For each respective determined offset frequency value, the computer is programmed to execute the MR pulse sequence having a central transmit frequency and a central receive frequency of the MR pulse sequence set to the respective determined offset frequency value. The computer is also programmed to acquire a three-dimensional (3D) MR data set for each MR pulse sequence execution and generate a composite image based on data from each of the acquired 3D MR data sets.

20 Claims, 3 Drawing Sheets

OTHER PUBLICATIONS

Cunningham et al., "Positive Contrast Magnetic Resonance Imaging of Cells Labeled with Magnetic Nanoparticles," Magnetic Resonance in Medicine, vol. 53, 2005, pp. 999-1005.

Volk et al., "Chemical Shift-Specific Slice Selection. A New Method for Chemical Shift Imaging at High Magnetic Field," Journal of Magnetic Resonance, vol. 71, 1987, pp. 168-174.

Skare et al., "Correction of MR Image Distortions Induced by Metallic Objects Using a 3D Cubic B-Spline Basis Set: Application to Stereotactic Surgical Planning," Magnetic Resonance in Medicine, vol. 54, 2005, pp. 169-181.

Dahnke et al., "Optimal Positive Contrast of Labeled Cells via Conventional 3D Imaging," Proc. Intl. Soc. Mag. Reson. Med., vol. 14, 2006, p. 361.

Koch et al., "Z-Selective Multi-Spectal 3D Imaging: A MAVRIC-SEMAC Hybrid," Oral Presentation, 2010 ISMRM Annual Meeting, pp. 1-13.

Koch et al., "A Multispectral Three-Dimensional Acquisition Technique for Imaging Near Metal Implants," Magnetic Resonance in Medicine, vol. 61, 2009, pp. 381-390.

Lu et al., "SEMAC: Slice Encoding for Metal Artifact Correction in MRI," Magnetic Resonance in Medicine, vol. 62, 2009, pp. 66-76.

Koch et al., "Z-Selective Multi-Spectral 3D Imaging: A MAVRIC-SEMAC Hybrid," Abstract, 2010 ISMRM Annual Meeting, p. 139.

Koch et al., "MAVRIC Imaging Near Metal Implants with Improved Spatial Resolution and Reduced Acquisition Time," Poster, 2010 ISMRM Annual Meeting, p. 1.

* cited by examiner

SYSTEM AND METHOD FOR MULTI-SPECTRAL MR IMAGING NEAR METAL

CROSS-REFERENCE TO RELATED APPLICATION

The present application is a continuation-in-part and claims priority to U.S. patent application Ser. No. 12/016,331 filed Jan. 18, 2008.

GOVERNMENT LICENSE RIGHTS

This invention was made with Government support under contract EB008190 awarded by the National Institutes of Health. The Government has certain rights in this invention.

BACKGROUND OF THE INVENTION

Embodiments of the invention relates generally to magnetic resonance (MR) imaging and, more particularly, to MR imaging near metal.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The use of MR in musculoskeletal (MSK) diagnostics is a rapidly growing field. Arthroplasty is the surgical placement of implants. The population of patients having some form of metal implant is quite large and growing rapidly. MR has significant capabilities in assisting the diagnosis of implant revisions. Using magnetic resonance imaging to assist in clinical diagnostics of MR-compatible arthroplastic implants, however, has proven a fundamentally challenging problem. Most materials that are robust and durable enough to be utilized for bone replacements will have magnetic properties that, when placed in a typical $B_0$ magnetic field, induce extraneous fields of amplitude and spatial variation that are large compared to the field offsets utilized in conventional spatial encoding. Accordingly, these materials can introduce distortions in the main magnetic field resulting in an inhomogeneous magnetic field.

While the signal loss induced by these field gradients can largely be regained through the use of Hahn spin-echoes, the distortion they produce in both the readout and slice directions are drastic and are typically unacceptable for clinical evaluation. Despite these challenges, MRI has been shown to be quite useful in the diagnosis of degenerative conditions in arthroscopic patients. In particular, MRI has been used to screen perioprosthetic soft tissues, diagnose osteolysis, and visualize implant interfaces. These diagnostic mechanisms benefit significantly from visual information near implant interfaces. Unfortunately, artifacts induced by the implants in conventional MRI images are most severe near the implant interfaces.

A proposed approach to reducing MRI artifacts induced by implants is 2D FSE imaging using View-Angle Tilting (VAT). Though this approach can improve in-plane distortions at the cost of significant image blurring, it does not address distortions in the slice-selection direction. Near the most paramagnetic of utilized metallic implants, distortions in the slice-selection direction can almost completely disfigure 2D MR images. While a slice-distortion correction of VAT images in the slice direction has been proposed, its use is limited because it does not correct signal-pileup effects of image distortion.

It would therefore be desirable to have a system and method capable of reducing image artifacts near or around implant interfaces. It would further be desirable to improve clinical diagnostic access to regions of interest near or around implant interfaces.

BRIEF DESCRIPTION OF THE INVENTION

According to one aspect of the invention, a magnetic resonance (MRI) apparatus comprises an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to calculate an MR pulse sequence comprising a plurality of RF pulses configured to excite spins in an imaging object and comprising a plurality of volume selection gradients and determine a plurality of distinct offset frequency values. For each respective determined offset frequency value, the computer is programmed to execute the MR pulse sequence having a central transmit frequency and a central receive frequency of the MR pulse sequence set to the respective determined offset frequency value. The computer is also programmed to acquire a three-dimensional (3D) MR data set for each MR pulse sequence execution and generate a composite image based on data from each of the acquired 3D MR data sets.

According to another aspect of the invention, a method of magnetic resonance (MR) imaging comprises calculating a plurality of 3D MR data acquisitions, each 3D MR data acquisition comprises a plurality of RF pulses configured to excite spins in an imaging object; and a plurality of volume selection gradients. The method also comprises determining a distinct central frequency for each of the plurality of 3D MR data acquisitions and performing the plurality of 3D MR data acquisitions, each 3D MR data acquisition having a central transmit frequency and a central receive frequency set to the distinct central frequency determined therefor. A composite image is generated from the plurality of 3D MR data acquisitions.

According to another aspect of the invention, a non-transitory computer readable storage medium having stored thereon a computer program comprising instructions which when executed by a computer cause the computer to calculate a first 3D MR acquisition comprising a plurality of RF pulses configured to excite spins in an imaging object and comprising a plurality of volume selection gradients. The instructions also cause the computer to set a center transmission frequency and a center reception frequency of the first 3D MR acquisition equal to a first center frequency offset, to execute the first 3D MR acquisition to acquire a first set of 3D MR data, and to calculate a second 3D MR acquisition comprising a plurality of RF pulses configured to excite spins in an imaging object and comprising a plurality of volume selection gradients. The instructions further cause the computer to set a center transmission frequency and a center reception frequency of the second 3D MR acquisition equal to a second center frequency offset different than the first center frequency offset, to execute the second 3D MR acquisition to acquire a second set of 3D MR data; and to reconstruct a composite image based on the first and second sets of 3D MR data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

An apparatus and method is provided that acquires multiple 3D MR data sets where the center transmission frequency and the center reception frequency of each 3D MR data acquisition are set to an offset frequency that is distinct for each 3D MR data set. A single image is constructed from the 3D MR data sets having reduced artifacts and reduced image distortion.

An apparatus and method is provided that acquires multiple 3D MR data sets where the center transmission frequency and the center reception frequency of each 3D MR data acquisition are set to an offset frequency that is distinct for each 3D MR data set. A single image is constructed from the 3D MR data sets having reduced artifacts and reduced image distortion.

Figure 1:
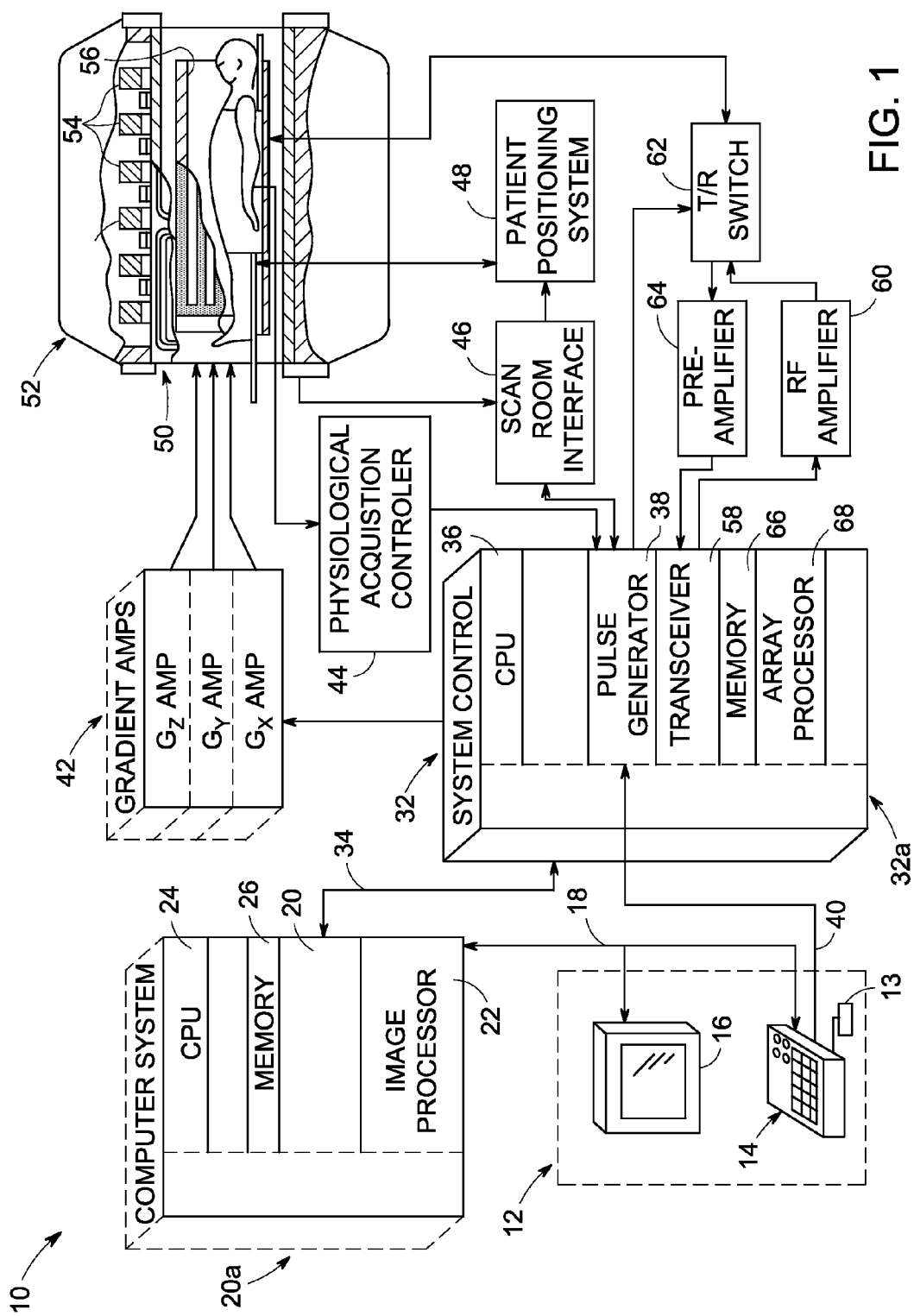
FIG. 1 is a schematic block diagram of an exemplary MR imaging system incorporating embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
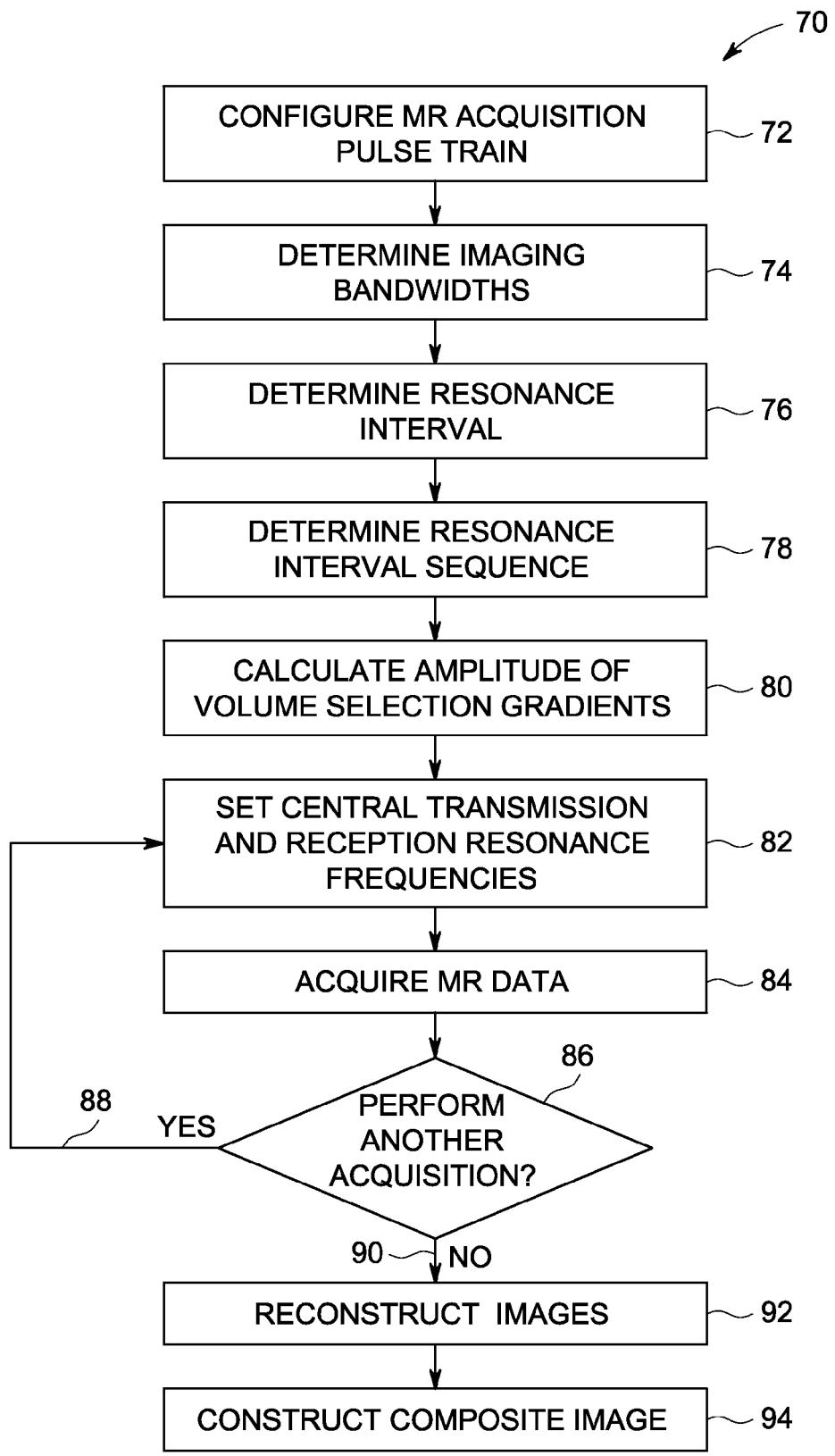
FIG. 2 is a flowchart of an MR imaging technique according to an embodiment of the invention.

FIG. 2 shows a technique 70 for MR imaging near or around patient metallic implants according to an embodiment of the invention. In an embodiment of the invention, technique 70 will be described with respect to 3D Fast Spin Echo (FSE) MR imaging; however, it is contemplated that technique 70 may also apply to 3D spin-echo sequences and other 3D MR acquisition techniques. In an embodiment of the invention, computer system 20 may be programmed to perform technique 70. Technique 70 begins with configuring a pulse train of an MR acquisition pulse sequence at block 72 to be used during each MR acquisition of the MR imaging to acquire a 3D MR data set. The pulse sequence excites spins in an imaging object such that MR data may be acquired therefrom. The shape of RF pulses of the pulse train within the MR acquisition pulse sequence is also configured at block 72. In an embodiment of the invention, a Gaussian pulse shape is used as the shape for the RF pulses of the pulse train. In another embodiment of the invention, the pulse shape used may be based on a spatial-spectral pulse shape or on the shape of a hard or square pulse.

At block 74, imaging bandwidths for the MR acquisitions are determined. An excitation pulse bandwidth for the MR acquisition pulse sequence to be used for acquiring MR data is determined as well as a bandwidth of utilized refocusing pulses. The utilized refocusing pulse bandwidth is determined to be equal to or less than the bandwidth of the excitation pulse. A receiver bandwidth for the receive coil array used to acquire MR data during the MR acquisition pulse sequence is set to a bandwidth larger than that typically used in 3D FSE imaging. In an example, the receiver bandwidth is set to +/−125 kHz. It is contemplated that the receiver bandwidth may also be set to a value greater than +/−125 kHz. In the described technique, off-resonance readout distortion is limited to frequency offsets contained in the RF refocusing band. Setting the receiver bandwidth accordingly helps to minimize this residual readout distortion in reconstructed images.

A resonance interval is determined at block 76 that represents an offset for both the center resonance frequency for transmission and the center resonance frequency for reception between sets of acquired MR data. According to an embodiment of the invention, the resonance interval is less than the bandwidth of the utilized refocusing pulses. At block 78, a resonance interval sequence is determined for acquiring 3D MR data sets. The resonance interval sequence includes distinct offset frequency values, or $B_0$ values, to which central transmission and central reception resonance frequencies are set during MR acquisition. In an embodiment of the invention, the resonance interval sequence includes an offset frequency value of zero. Additional values in the resonance interval sequence include multiples of the resonance interval. For example, the resonance interval sequence may include values for the central transmission and central reception resonance frequencies to be set to each 1 kHz offset step in the range −7 kHz to +7 kHz.

In an embodiment of the invention, the resonance interval sequence is set to interleave or interlace the offset frequency values such that sequential MR acquisitions based on the offset frequency values do not acquire MR data with the central transmission and central reception resonance frequencies set to sequential offset frequency values. For example, an interleaved resonance interval sequence with a 1 kHz resonance interval (or offset step) in the range −7 kHz to +7 kHz may have the following order: [−7, 1, −5, 3, −3, 5, −1, 7, −6, 0, −4, 6, −2, 4, 2 kHz]. Accordingly, neighboring values in the resonance interval sequence are separated by more than the offset step of 1 kHz. Interleaving the resonance interval sequence in this manner reduces interaction between 3D MR data acquisitions in an imaging scan. As described further below, each offset frequency value in the resonance interval sequence is used as the central transmission and reception frequency for a different 3D MR data acquisition. In one embodiment, an MR imaging scan (or protocol) may be configured such that a first set of acquisitions uses a resonance interval sequence with the offset frequency values [−7, 1, −5, 3, −3, 5, −1, 7 kHz] during a single scan and such that a second set of acquisitions uses a resonance interval sequence with the offset frequency values [−6, 0, −4, 6, −2, 4, 2 kHz] during another single scan. The resonance interval sequence values listed above are illustrative only and do not limit the invention. Other and different orders and values for the resonance interval sequence values are considered and are within the scope of the invention.

At block 80, the amplitude of a plurality of volume selection gradients is determined or configured. In one embodiment, the volume selection gradients are applied in the slice selection direction. While the slice selection direction is referred to herein as being in the z-direction, it is illustrative only and does not limit the invention. Other and different slice selection directions are considered and are within the scope of the invention.

Determination of the amplitude is based on a desired field-of-view (FOV) and spectral coverage. For example, consider an acquisition with $N_b$ spectral bins and a bin separation of $\Omega_b$ kHz. The excited z FOV, according to an embodiment, is desired to be restricted to $\Delta Z$ cm. This can be accomplished by applying the pulse sequence excitations under a z or slice select gradient of $G_z$ amplitude according to the following expression:

$$G_z = \frac{2\pi N_b \Omega_b}{\gamma \Delta Z}, \quad \text{(Eqn. 1)}$$

where $N_b$ is the number of spectral bins, $\Omega_b$ is the gap between center frequencies of spectral bins, $\gamma$ is the gyromagnetic ratio of protons, and Gz corresponds to a gradient strength or amplitude of volume selection gradients in a slice selection direction.

At block 82, the central transmission and central reception resonance frequencies for a 3D MR data acquisition are both set to one of the values in the resonance interval sequence, in particular, the central transmission frequency and the central reception frequency for the acquisition are set to the same offset frequency value. 3D MR data is acquired at block 84 using the scan parameters and sequences configured and determined in the previous steps of technique 70. In an embodiment of the invention, the 3D MR data is acquired using non-parallel imaging techniques. The 3D MR data may be acquired via multi-channel RF coil 56 of FIG. 1 or via another multi-channel receive coil. However, it is contemplated that parallel imaging techniques such as ARC, and the like may also be used and that multiple multi-channel receive coils may be used to acquire the 3D MR data. At block 86, it is determined if another 3D MR data acquisition should be performed. If all the offset frequency values in the resonance interval sequence have not been used 88, then process control returns to block 82 for setting the central transmission and central reception resonance frequencies for the next 3D MR data acquisition to another of the offset frequency values in the resonance interval sequence and at block 84 3D MR data for another 3D MR data set is acquired as described above. If all the offset frequency values in the resonance interval sequence have been used 90, an image is reconstructed at block 92 for each MR data set acquired, resulting in a collection of images. Each image is reconstructed using known reconstruction techniques.

A final, single composite image is constructed at block 94. In an embodiment of the invention, the composite image is constructed using the maximum intensity projection (MIP) of each pixel from the collection of images. A pre-determined pixel location in each image of the collection of images is used to determine which image contains the greatest intensity projection for the pre-determined pixel location. The greatest intensity projection value is then used for the same location in the final composite image.

Figure 3:
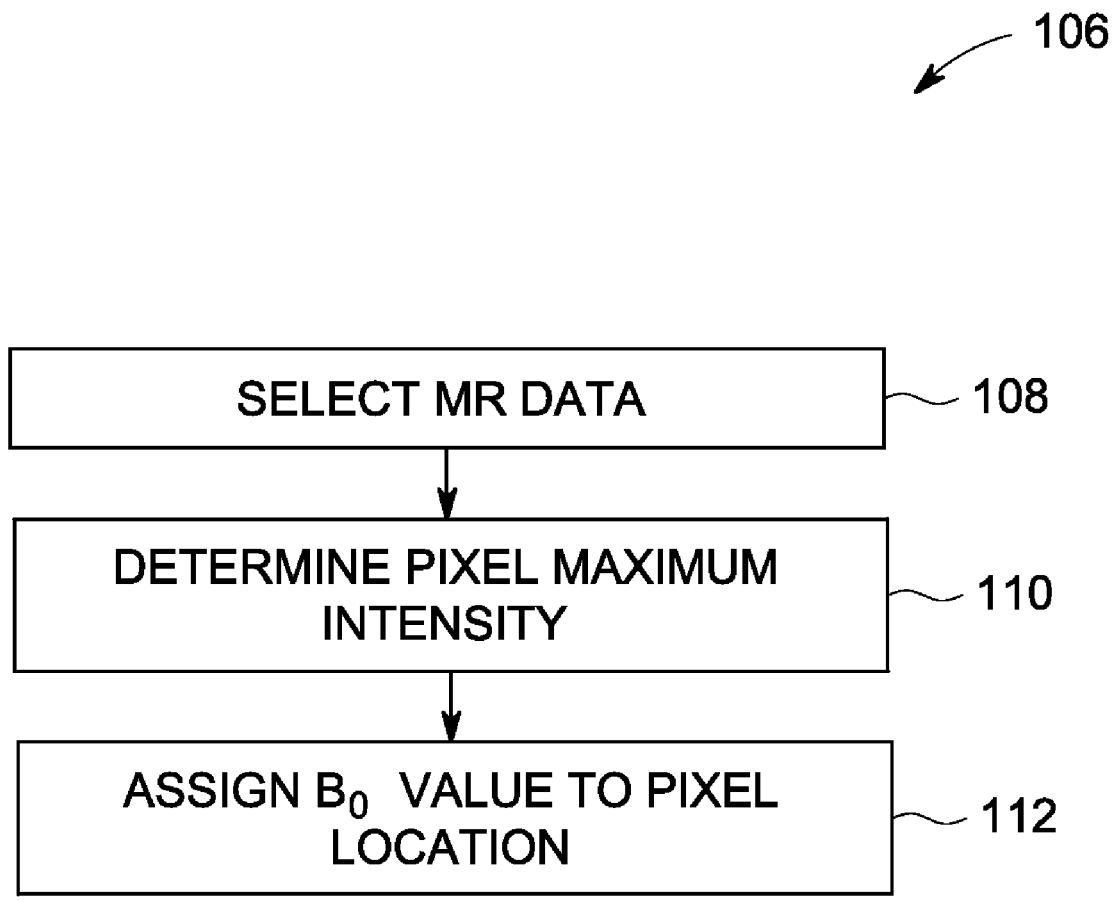
FIG. 3 is a technique for constructing a magnetic field map according to an embodiment of the invention.

In another embodiment, the final, single composite image may be constructed at block 94 using iterative reconstruction based on a magnetic field map. FIG. 3 shows a technique 96 for constructing a magnetic field map according to an embodiment of the invention. At block 98, a plurality of reconstructed MR images are selected. In one embodiment, the plurality of reconstructed MR images are retrieved from an image storage location such as memory 26 shown in FIG. 1 or another computer readable storage medium. The plurality of reconstructed images may be generated using the technique described above with respect to FIG. 2. In another embodiment, the plurality of reconstructed MR images may be generated on-the-fly. For example, the plurality of MR images may be generated using the technique described above with respect to FIG. 2. At block 100, the pixels for each of the plurality of MR images are examined to determine, for each pixel location, which image of the plurality of MR images has the maximum intensity. At block 102, each pixel location in the magnetic field map is assigned the offset frequency value, or $B_0$ value, to which the central transmission and central reception resonance frequencies are set to in the image determined to have the maximum intensity for the corresponding pixel location. For example, for a given magnetic field map pixel location, the image acquired with the central transmission and central reception resonance frequencies set to 3 kHz may have the maximum intensity for the corresponding pixel location. Accordingly, the value of 3 kHz is used for the given magnetic field map pixel location. For an adjacent magnetic field map pixel location, it may be determined that the image acquired with the central transmission and central reception resonance frequencies set to −4 kHz may have the maximum intensity for the corresponding pixel location. Accordingly, the value of −4 kHz is used for the adjacent magnetic field map pixel location.

Returning to FIG. 2, in another embodiment, the composite image may be constructed at block 94 using a sum-of-squares method where the MR data sets are acquired using Gaussian-shaped pulses. One skilled in the art will recognize that the steps of technique 70 may be performed in another order than that described and that such is within the scope of embodiments of the invention.

Embodiments of the invention allow for improved MR imaging near or around metallic implants such that artifacts and image distortion are reduced. Embodiments of the invention are applicable in MR imaging where significant heterogeneity of the $B_0$ magnetic field exists.

A technical contribution for the disclosed method and apparatus is that is provides for a computer implemented method for MR imaging in inhomogeneous magnetic fields.

One skilled in the art will appreciate that embodiments of the invention may be interfaced to and controlled by a computer readable storage medium having stored thereon a computer program. The computer readable storage medium includes a plurality of components such as one or more electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, according to one embodiment of the invention, a magnetic resonance (MRI) apparatus comprises an MRI system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to calculate an MR pulse sequence comprising a plurality of RF pulses configured to excite spins in an imaging object and comprising a plurality of volume selection gradients and determine a plurality of distinct offset frequency values. For each respective determined offset frequency value, the computer is programmed to execute the MR pulse sequence having a central transmit frequency and a central receive frequency of the MR pulse sequence set to the respective determined offset frequency value. The computer is also programmed to acquire a three-dimensional (3D) MR data set for each MR pulse sequence execution and generate a composite image based on data from each of the acquired 3D MR data sets.

According to another embodiment of the invention, a method of magnetic resonance (MR) imaging comprises calculating a plurality of 3D MR data acquisitions, each 3D MR data acquisition comprises a plurality of RF pulses configured to excite spins in an imaging object; and a plurality of volume selection gradients. The method also comprises determining a distinct central frequency for each of the plurality of 3D MR data acquisitions and performing the plurality of 3D MR data acquisitions, each 3D MR data acquisition having a central transmit frequency and a central receive frequency set to the distinct central frequency determined therefor. A composite image is generated from the plurality of 3D MR data acquisitions.

According to yet another embodiment of the invention, a non-transitory computer readable storage medium having stored thereon a computer program comprising instructions which when executed by a computer cause the computer to calculate a first 3D MR acquisition comprising a plurality of RF pulses configured to excite spins in an imaging object and comprising a plurality of volume selection gradients. The instructions also cause the computer to set a center transmission frequency and a center reception frequency of the first 3D MR acquisition equal to a first center frequency offset, to execute the first 3D MR acquisition to acquire a first set of 3D MR data, and to calculate a second 3D MR acquisition comprising a plurality of RF pulses configured to excite spins in an imaging object and comprising a plurality of volume selection gradients. The instructions further cause the computer to set a center transmission frequency and a center reception frequency of the second 3D MR acquisition equal to a second center frequency offset different than the first center frequency offset, to execute the second 3D MR acquisition to acquire a second set of 3D MR data; and to reconstruct a composite image based on the first and second sets of 3D MR data.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance (MRI) apparatus comprising:
an MRI system having a plurality of gradient coils positioned about a bore of a magnet, and an RF transceiver system and an RF switch controlled by a pulse module to transmit RF signals to an RF coil assembly to acquire MR images; and
a computer programmed to:
calculate an MR pulse sequence comprising a plurality of RF pulses configured to excite spins in an imaging object and comprising a plurality of volume selection gradients;
determine a plurality of distinct offset frequency values;
for each respective determined offset frequency value, execute the MR pulse sequence having a central transmit frequency and a central receive frequency of the MR pulse sequence set to the respective determined offset frequency value;
acquire a three-dimensional (3D) MR data set for each MR pulse sequence execution; and
generate a composite image based on data from each of the acquired 3D MR data sets.

2. The MRI apparatus of claim 1 wherein the computer is further programmed to determine an amplitude of the plurality of volume selection gradients based on a desired field-of-view (FOV) and a desired spectral coverage.

3. The MRI apparatus of claim 2 wherein the computer is programmed to determine the amplitude of the plurality of volume selection gradients based on the equation:

$$G_z = \frac{2\pi N_b \Omega_b}{\gamma \Delta Z},$$

where $N_b$ corresponds to a number of spectral bins, $\Omega_b$ is corresponds to gap between center frequencies of spectral bins, $\gamma$ corresponds to a gyromagnetic ratio of protons, and $G_z$ corresponds to a gradient amplitude of the plurality of volume selection gradients in a given direction, z.

4. The MRI apparatus of claim 1 wherein the plurality of volume selection gradients comprises:
a first gradient configured to be applied in a slice direction during an excitation RF pulse of the plurality of RF pulses;
a second gradient configured to be applied in the slice direction during a refocusing RF pulse of the plurality of RF pulses; and
a third gradient configured to be applied in the slice direction during a readout gradient pulse of the MR pulse sequence.

5. The MRI apparatus of claim 1 wherein the computer is further programmed to reconstruct an image for each of the 3D MR data sets.

6. The MRI apparatus of claim 5 wherein the computer is further programmed to perform a maximum intensity projection technique on the reconstructed images to generate the composite image.

7. The MRI apparatus of claim 5, wherein the computer is further programmed to perform a sum-of-squares technique on the reconstructed images to generate the composite image.

8. The MRI apparatus of claim 5 wherein the computer is further programmed to generate a magnetic field map from the reconstructed images.

9. The MRI apparatus of claim 8 wherein the computer is further programmed to perform iterative reconstruction using the magnetic field map to generate the composite image.

10. The MRI apparatus of claim 1 wherein the computer is further programmed to interleave offset frequency values used to acquire the plurality of 3D MR data sets such that sequential 3D MR data sets are acquired using non-sequential offset frequency values.

11. A method of magnetic resonance (MR) imaging comprising:
calculating a plurality of 3D MR data acquisitions, each 3D MR data acquisition comprising:
a plurality of RF pulses configured to excite spins in an imaging object; and
a plurality of volume selection gradients;
determining a distinct central frequency for each of the plurality of 3D MR data acquisitions;
performing the plurality of 3D MR data acquisitions, each 3D MR data acquisition having a central transmit frequency and a central receive frequency set to the distinct central frequency determined therefor; and
generating a composite image from the plurality of 3D MR data acquisitions.

12. The method of claim 11 further comprising determining an amplitude of the plurality of volume selection gradients based on a desired field-of-view (FOV) and a desired spectral coverage.

13. The method of claim 12 wherein determining the amplitude of the plurality of volume selection gradients comprises determining the amplitude of the plurality of volume selection gradients based on the equation:

$$G_z = \frac{2\pi N_b \Omega_b}{\gamma \Delta Z},$$

where $N_b$ corresponds to a number of spectral bins, $\Omega_b$ is corresponds to gap between center frequencies of spectral bins, $\gamma$ corresponds to a gyromagnetic ratio of protons, and $G_z$ corresponds to a gradient amplitude of the plurality of volume selection gradients in a slice selection direction.

14. The method of claim 11 wherein performing each of the plurality of 3D MR data acquisitions comprises:
applying a first volume selection gradient of the plurality of volume selection gradients in a slice direction during an excitation RF pulse of the plurality of RF pulses;

applying a second volume selection gradient of the plurality of volume selection gradients in the slice direction during a refocusing RF pulse of the plurality of RF pulses; and applying a third volume selection gradient of the plurality of volume selection gradients in the slice direction during a readout gradient.

15. The method of claim 11 further comprising reconstructing an image for each of the plurality of 3D MR data acquisitions; and wherein generating the composite image comprises applying a maximum intensity projection technique on the reconstructed images.

16. A non-transitory computer readable storage medium having stored thereon a computer program comprising instructions which when executed by a computer cause the computer to:

calculate a first 3D MR acquisition comprising a plurality of RF pulses configured to excite spins in an imaging object and comprising a plurality of volume selection gradients;

set a center transmission frequency and a center reception frequency of the first 3D MR acquisition equal to a first center frequency offset;

execute the first 3D MR acquisition to acquire a first set of 3D MR data;

calculate a second 3D MR acquisition comprising a plurality of RF pulses configured to excite spins in an imaging object and comprising a plurality of volume selection gradients;

set a center transmission frequency and a center reception frequency of the second 3D MR acquisition equal to a second center frequency offset different than the first center frequency offset;

execute the second 3D MR acquisition to acquire a second set of 3D MR data; and reconstruct a composite image based on the first and second sets of 3D MR data.

17. The computer readable storage medium of claim 16 wherein the instructions that cause the computer to calculate the first and second 3D MR acquisitions cause the computer to:

determine an amplitude of the plurality of volume selection gradients based on the equation:

$$G_z = \frac{2\pi N_b \Omega_b}{\gamma \Delta Z},$$

where $N_b$ corresponds to a number of spectral bins, $\Omega_b$ is corresponds to gap between center frequencies of spectral bins, $\gamma$ corresponds to a gyromagnetic ratio of protons, and $G_z$ corresponds to a gradient amplitude of the plurality of volume selection gradients in a slice selection direction.

18. The computer readable storage medium of claim 16 wherein the instructions that cause the computer to calculate the first and second 3D MR acquisitions cause the computer to:

calculate a shape of the plurality of RF pulses based on a Gaussian pulse shape.

19. The computer readable storage medium of claim 16 wherein the instructions that cause the computer to reconstruct the composite image cause the computer to:

construct a magnetic field map based on at least the first and second sets of 3D MR data; and iteratively reconstruct the composite image based on at least the magnetic field map and the first and second sets of 3D MR data.

20. The computer readable storage medium of claim 16 wherein the instructions further cause the computer to:

calculate a third 3D MR acquisition comprising a plurality of RF pulses configured to excite spins in an imaging object and comprising a plurality of volume selection gradients;

set a center transmission frequency and a center reception frequency of the third 3D MR acquisition equal to a third center frequency offset;

execute the third 3D MR acquisition to acquire a third set of 3D MR data; and interleave the center transmission and reception frequencies of the first, second, and third 3D MR acquisitions such that the center transmission and reception frequencies of one of the first and third 3D MR acquisitions is between the center transmission and reception frequencies of the other 3D MR acquisitions.

* * * * *

UNITED STATES PATENT AND TRADEMARK OFFICE
CERTIFICATE OF CORRECTION

| | | |
|---|---|---|
| PATENT NO. | : 8,274,286 B2 | Page 1 of 1 |
| APPLICATION NO. | : 12/860272 | |
| DATED | : September 25, 2012 | |
| INVENTOR(S) | : Koch et al. | |

It is certified that error appears in the above-identified patent and that said Letters Patent is hereby corrected as shown below:

Title Page, Item (73), Assignees, delete "Trustees of the Leland Standford, Jr." and substitute therefore -- Trustees of the Leland Stanford, Jr. --.

Signed and Sealed this
Twentieth Day of November, 2012

David J. Kappos
*Director of the United States Patent and Trademark Office*